United States Patent
Meredith et al.

(10) Patent No.: US 6,185,182 B1
(45) Date of Patent: Feb. 6, 2001

(54) POWER SHARING AMPLIFIER SYSTEM FOR A CELLULAR COMMUNICATIONS SYSTEM

(75) Inventors: Sheldon K. Meredith, Redmond, WA (US); Robert S. Larkin, Corvallis, OR (US)

(73) Assignee: Radio Frequency Systems, Inc., Marlboro, NJ (US)

(*) Notice: Under 35 U.S.C. 154(b), the term of this patent shall be extended for 0 days.

(21) Appl. No.: 09/098,660

(22) Filed: Jun. 17, 1998

(51) Int. Cl.[7] .................................................. H04J 11/00
(52) U.S. Cl. ............................................... 370/210
(58) Field of Search ................................. 370/210, 211, 370/274, 275, 276, 297, 318, 328, 329, 332, 334, 339, 293; 342/152, 174, 25, 132, 191, 379; 358/432; 348/403; 330/45, 276, 280, 124, 51, 286; 333/127, 125, 119, 128, 132, 109; 455/272, 273, 137, 517, 422, 436, 507, 671, 673, 101

(56) References Cited

U.S. PATENT DOCUMENTS

| | | | |
|---|---|---|---|
| 3,710,281 | 1/1973 | Thomas | 333/6 |
| 3,731,217 | 5/1973 | Gerst et al. | 330/56 |

(List continued on next page.)

FOREIGN PATENT DOCUMENTS

| | | |
|---|---|---|
| 0333166 | 9/1989 | (EP) . |
| 0593822 | 4/1994 | (EP) . |
| 0704964 | 4/1996 | (EP) . |
| 0755129 | 1/1997 | (EP) . |
| 0756431 | 1/1997 | (EP) . |
| 9810513 | 3/1998 | (WO) . |

OTHER PUBLICATIONS

Larkin, R.S., "Multiple–Signal Intermodulation and Stability Considerations in the Use of Linear Repeaters", IEEE Vehicular Technology Conference, 1991.

Brigham, E.O., "The Discrete Fourier Transform", Prentice Hall 1974, pp. 91–99.

Norgaard, D.E., "The Phase–Shift Method of Single–Sideband Signal Generation", Proc. IRE, pp. 1718–1735, Dec. 1956.

T. Ha, Solid State Microwave Amplifier Design, John Wiley and Sons, 1981, pp. 268–270.

Pappenfus et al., "Single Sideband Principles and Circuits", McGraw-Hill Book Company, Copyright © 1964, Library of Congress Card No. 63–13938, 789–MAMM–754321, 48455, SSB Generation, pp. 33–41.

*Primary Examiner*—Dang Ton
(74) *Attorney, Agent, or Firm*—Ware, Fressola, Van Der Sluy & Adolphson LLP

(57) ABSTRACT

The invention provides a power sharing amplifier system for a cellular communications system, having with an 8th order transform matrix circuit, eight power sharing amplifiers and an 8th order inverse transform matrix circuit. The 8th order transform matrix circuit has six input ports and responds to six RF input signals for providing 8th order transform matrix RF input signals. The 8th order transform matrix circuit also has two input ports that do not receive input signals, but instead are coupled through a resistor to ground. The eight power sharing amplifiers respond to the 8th order transform matrix RF input signals, for providing eight amplified transformed RF signals. The 8th order inverse transform matrix circuit responds to the eight amplified transformed RF signals, for providing six inverse transform amplified RF output signals to six output ports. The 8th order inverse transform matrix circuit also has two output ports that do not provide output signals to an antenna, but instead are coupled through a resistor to ground for dissipating intermodulation distortion products.

1 Claim, 4 Drawing Sheets

U.S. PATENT DOCUMENTS

| | | | |
|---|---|---|---|
| 3,783,385 | 1/1974 | Dunn et al. | 375/329 |
| 3,964,065 | 6/1976 | Roberts et al. | 342/380 |
| 4,091,387 | 5/1978 | Profera | 343/754 |
| 4,163,974 | 8/1979 | Profera | 343/16 |
| 4,375,650 | 3/1983 | Tiemann | 364/725 |
| 4,603,408 | 7/1986 | Singhal et al. | 367/92 |
| 4,647,868 | 3/1987 | Mueller | 330/286 |
| 4,689,631 | 8/1987 | Gans et al. | 343/781 R |
| 4,774,481 | 9/1988 | Edwards et al. | 333/127 |
| 4,785,267 | 11/1988 | Covill | 333/125 |
| 4,814,730 | 3/1989 | Via et al. | 333/119 |
| 4,835,496 | 5/1989 | Schellenberg et al. | 333/128 |
| 4,932,049 | 6/1990 | Lee | 379/60 |
| 5,032,804 | 7/1991 | Hollingsworth | 333/132 |
| 5,067,147 | 11/1991 | Lee | 379/60 |
| 5,070,304 | 12/1991 | Salib et al. | 330/54 |
| 5,091,875 | 2/1992 | Wong et al. | 364/726 |
| 5,111,166 | 5/1992 | Plonka et al. | 333/128 |
| 5,162,804 | 11/1992 | Uyeda | 342/373 |
| 5,168,375 | 12/1992 | Reisch et al. | 358/432 |
| 5,187,447 | 2/1993 | Tsai | 330/124 |
| 5,193,109 | 3/1993 | Lee | 379/60 |
| 5,206,604 | 4/1993 | Vaninetti | 330/295 |
| 5,214,394 | 5/1993 | Wong | 330/286 |
| 5,222,246 | 6/1993 | Wolkstein | 455/13.4 |
| 5,239,667 | 8/1993 | Kanai | 455/10 |
| 5,245,347 | 9/1993 | Bonta et al. | 342/149 |
| 5,302,914 | 4/1994 | Arntz et al. | 330/129 |
| 5,304,943 | 4/1994 | Koontz | 330/51 |
| 5,313,174 | 5/1994 | Edwards | 333/109 |
| 5,394,349 | 2/1995 | Eddy | 364/725 |
| 5,604,462 | 2/1997 | Gans et al. . | |
| 5,638,024 | 6/1997 | Dent et al. . | |
| 5,742,584 * | 4/1998 | Meredith | 370/210 |
| 5,764,104 | 6/1998 | Luz | 330/149 |
| 5,790,517 * | 8/1998 | Meredith | 370/210 |

* cited by examiner

| INPUT | OUTPUT |
|-------|--------|
| 1 | 6 |
| 2 | 5 |
| 3 | 8 |
| 4 | 7 |
| 5 | 2 |
| 6 | 1 |
| 7 | 4 |
| 8 | 3 |

A MAPPING OF SIGNAL PATHS FROM INPUT TO OUTPUT FOR THE 8 BY 8 CELLULAR CONFIGURATION.

FIG. 1B

|   | A | B | C | D | E | F | G | H |
|---|---|---|---|---|---|---|---|---|
| 1 | 0 | 3 | 3 | 2 | 2 | 1 | 3 | 2 |
| 2 | 0 | 3 | 3 | 2 | 0 | 3 | 1 | 0 |
| 3 | 0 | 3 | 1 | 0 | 0 | 3 | 3 | 2 |
| 4 | 0 | 3 | 1 | 0 | 2 | 1 | 1 | 0 |
| 5 | 0 | 1 | 1 | 2 | 0 | 1 | 3 | 0 |
| 6 | 0 | 1 | 1 | 2 | 2 | 3 | 1 | 2 |
| 7 | 0 | 1 | 3 | 0 | 2 | 3 | 3 | 0 |
| 8 | 0 | 1 | 3 | 0 | 0 | 1 | 1 | 2 |

FIG. 1C

PHASE SHIFTS IN MULTIPLES OF 90 DEGREES BETWEEN PORTS 1 TO 8 AND PORTS A TO H FOR AN 8TH ORDER TRANSFORM MATRIX.

OUTPUT MAP FOR 6 INPUTS AND 8 AMPLIFIERS

| | OUTPUT PORT | | | | | | | |
|---|---|---|---|---|---|---|---|---|
| | 1 | 2 | 3 | 4 | 5 | 6 | 7 | 8 |
| 11 Hz | −61.6 | | | | | | | |
| 13 Hz | | −54.8 | | | | | | |
| 15 Hz | −54.8 | | −55.6 | | | | −61.6 | |
| 17 Hz | | −61.6 | | −52.2 | | | | −54.8 |
| 19 Hz | −61.6 | | −52.2 | | −52.2 | | −54.8 | |
| 21 Hz | | −54.8 | | −55.6 | | −9.3 | | −61.6 |
| 23 Hz | −54.8 | | −55.6 | | −9.3 | | −52.2 | |
| 25 Hz | | −61.6 | | −52.2 | | −52.2 | | −9.3 |
| 27 Hz | −52.2 | | −52.2 | | −61.6 | | −9.3 | |
| 29 Hz | | −9.3 | | −55.6 | | −54.8 | | −52.2 |
| 31 Hz | −9.3 | | −55.6 | | −54.8 | | −61.6 | |
| 33 Hz | | −52.2 | | −52.2 | | −61.6 | | −54.8 |
| 35 Hz | | | −52.2 | | −61.6 | | −54.8 | |
| 37 Hz | | | | −55.6 | | −54.8 | | −61.6 |
| 39 Hz | | | | | −54.8 | | | |
| 41 Hz | | | | | | −61.6 | | |

MAP SHOWING AVERAGE POWER AT OUTPUT OF 8 PORTS WITH 6 INPUTS. OUT-OF-BAND SIGNALS AND DESIRED SIGNALS (−9.3) ARE SHOWN IN BOLD FACE. −54.8 AND −52.2 LEVELS ARE FROM MULTIPLE IM PRODUCTS ADDED TOGETHER. OTHERS ARE SINGLE. INPUTS ARE PORT 1=21 Hz, PORT 2=23 Hz, ETC. BLANK AREAS ARE LOW POWER, LIMITED BY NETWORK BALANCE.

FIG. 3 ated as 100. similar to that shown and
POWER SHARING AMPLIFIER SYSTEM FOR A CELLULAR COMMUNICATIONS SYSTEM This application claims benefit to U.S. Pat. No. 5,790,517, filed Jul. 26, 1996 and issued on Aug. 4, 1998.

BACKGROUND OF THE INVENTION

1. Field of the Invention

The present invention relates generally to a power sharing amplifier system; and more particularly, related to a power sharing amplifier system for a cellular communication system.

2. Description of the Prior Art

FIG. 1A shows an 8 by 8 cellular transmitter configuration generally indicated as 100 similar to that shown and described in U.S. patent application Ser. No. 08/683,735. The 8 by 8 cellular configuration 100 includes eight separate low power transmitters generally indicated 102, an 8th order transform matrix circuit 104, eight amplifiers generally indicated 106, an 8 by 8 inverse transform matrix circuit 108, and eight antennas generally indicated as 110.

FIG. 1B shows a mapping of each input port to a respective output port in the 8th order cellular configuration.

FIG. 1C shows a chart of phase shifts for the 8th order transform matrix circuit 104 and the 8th order inverse transform matrix circuit 108 in the 8 by 8 cellular configuration.

When configured as shown, there is only one output (antenna) port for each input (low power transmitter) port, as shown in the mapping of FIG. 1B.

The amplification sharing technique used in the 8 by 8 cellular configuration 100 offers some advantages over the amplification technique of the standard cellular configuration. For example, in the 8 by 8 cellular configuration 100, the amplifiers 108 effectively share the amplification of all the input signals, which provide inherent redundancy in the overall amplification of the input signals. Thus, if one amplifier fails, then all sectors still operate and maintain communication between the subscriber and the land mobile radio system. In such a case, the 8 by 8 cellular configurations 100 may be operating in a less desirable operating mode, but nevertheless it still operates and allows additional time for the failed amplifier to be repaired or replaced. Moreover, the 8 by 8 cellular configuration 100 also uses fewer amplifiers than the standard cellular configuration if redundant amplifiers are maintained for each sector. These advantages combine to make the improved cellular configuration 100 less expensive and more reliable than the standard cellular configuration.

However, one disadvantage of the 8 by 8 cellular configuration 100 shown is that the amplification sharing technique results in intermodulation products between the eight input signals to the various amplifiers that distort the amplified RF output signal sent to and transmitted by the antenna 110.

SUMMARY OF THE INVENTION

In its broadest sense, the present invention provides a power sharing amplifier system for a cellular communications system, having with an 8th order transform matrix circuit, eight power sharing amplifiers and an 8th order inverse transform matrix circuit.

The 8th order transform matrix circuit has six input ports that respond to six RF input signals and has eight output ports that provide 8th order transform matrix RF input signals. The 8th order transform matrix circuit also has two input ports that do not receive input signals, but instead are coupled through a resistor to ground.

The eight power sharing amplifiers respond to the 8th order transform matrix input signals and provide eight amplified transformed RF signals.

The 8th order inverse transform matrix circuit has eight input ports that responds to the eight amplified transformed signals, and has six output ports that provide six inverse transform amplified RF output signals to six output ports. The 8th order inverse transform matrix circuit also has two output ports that do not provide output signals to an antenna, but instead are coupled through a resistor to ground for dissipating intermodulation distortion products.

The present invention provides a new and unique power sharing amplifier system that reduces the undesirable effects of the intermodulation distortion products that result from the shared amplification technique.

Other objects of the invention will in part be apparent and will in part appear hereinafter.

Accordingly, the invention comprises the features of construction, combination of elements, and arrangement of parts which will be exemplified in the construction hereinafter set forth, and the scope of the invention will be indicated in the claims.

BRIEF DESCRIPTION OF THE DRAWING

For a fuller understanding of the nature of the invention, reference should be made to the following detailed descriptions taken in connection with the accompanying drawing, which is not drawn to scale:

FIG. 1B is a mapping of each input port to a respective output port for the 8 by 8 cellular configuration shown in FIG. 1A.

FIG. 1C is a chart of phase shifts from input ports 1–8 to output ports A–H for an 8th order transform matrix or for an 8th order inverse transform matrix for the 8 by 8 cellular configuration shown in FIG. 1A.

FIG. 3 is an output map for the 6 by 8 cellular configuration shown in FIG. 2.

BEST MODE FOR CARRYING OUT THE INVENTION

Figure 2:
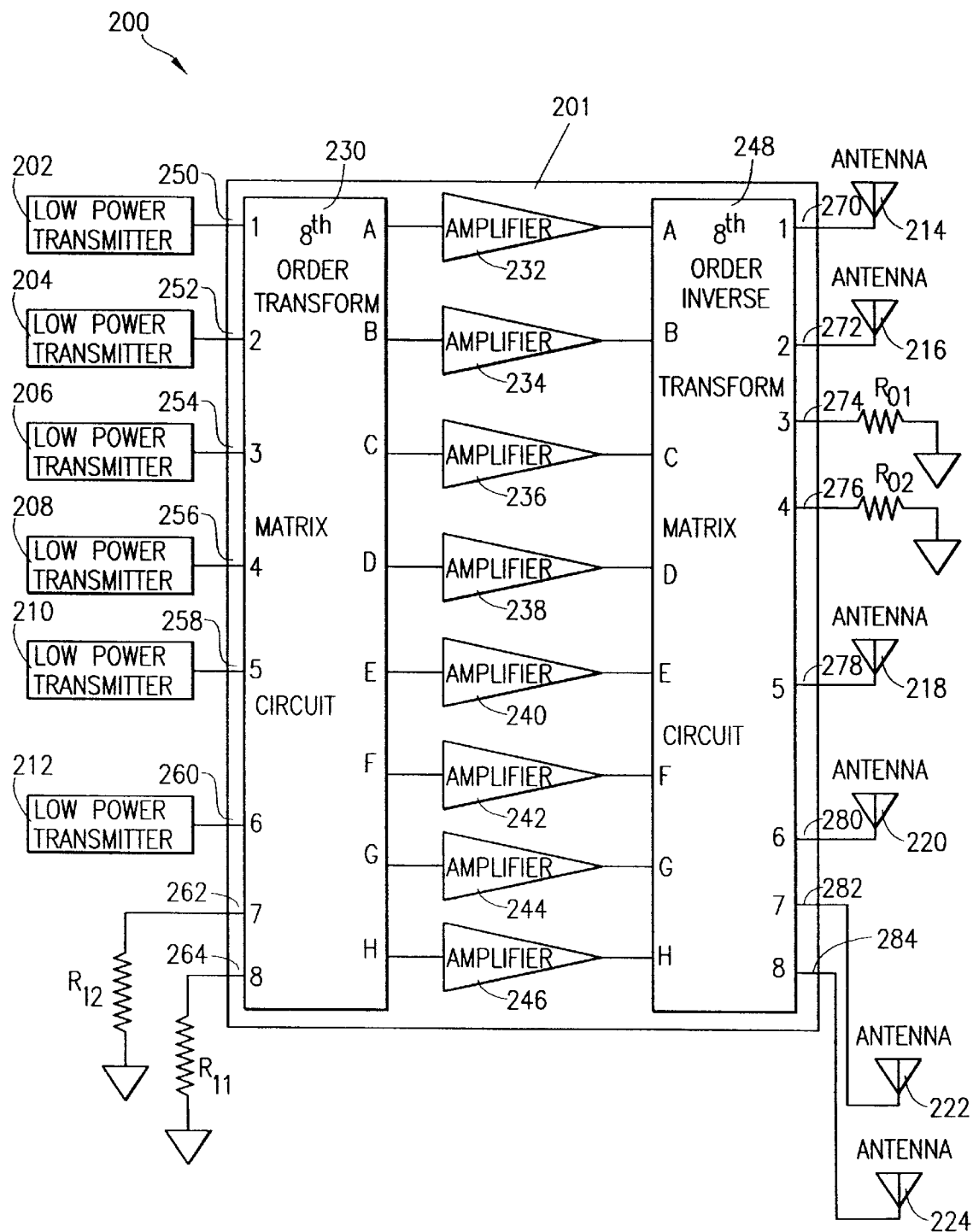
FIG. 2 is a block diagram of a 6 by 8 cellular configuration that is the subject matter of the present invention.

FIG. 2 shows a 6 by 8 cellular configuration generally indicated as 200 having a power sharing amplifying system 201 coupled between six low power transmitters, 202, 204, 206, 208, 210, 212 and six antennas 214, 216, 218, 220, 222, 224.

The power sharing amplifying system 201 has an 8th order transform matrix circuit 230, eight amplifiers 232, 234, 236, 238, 240, 242, 244, 246, and an 8th order inverse transform matrix circuit 248.

Figure 1A:
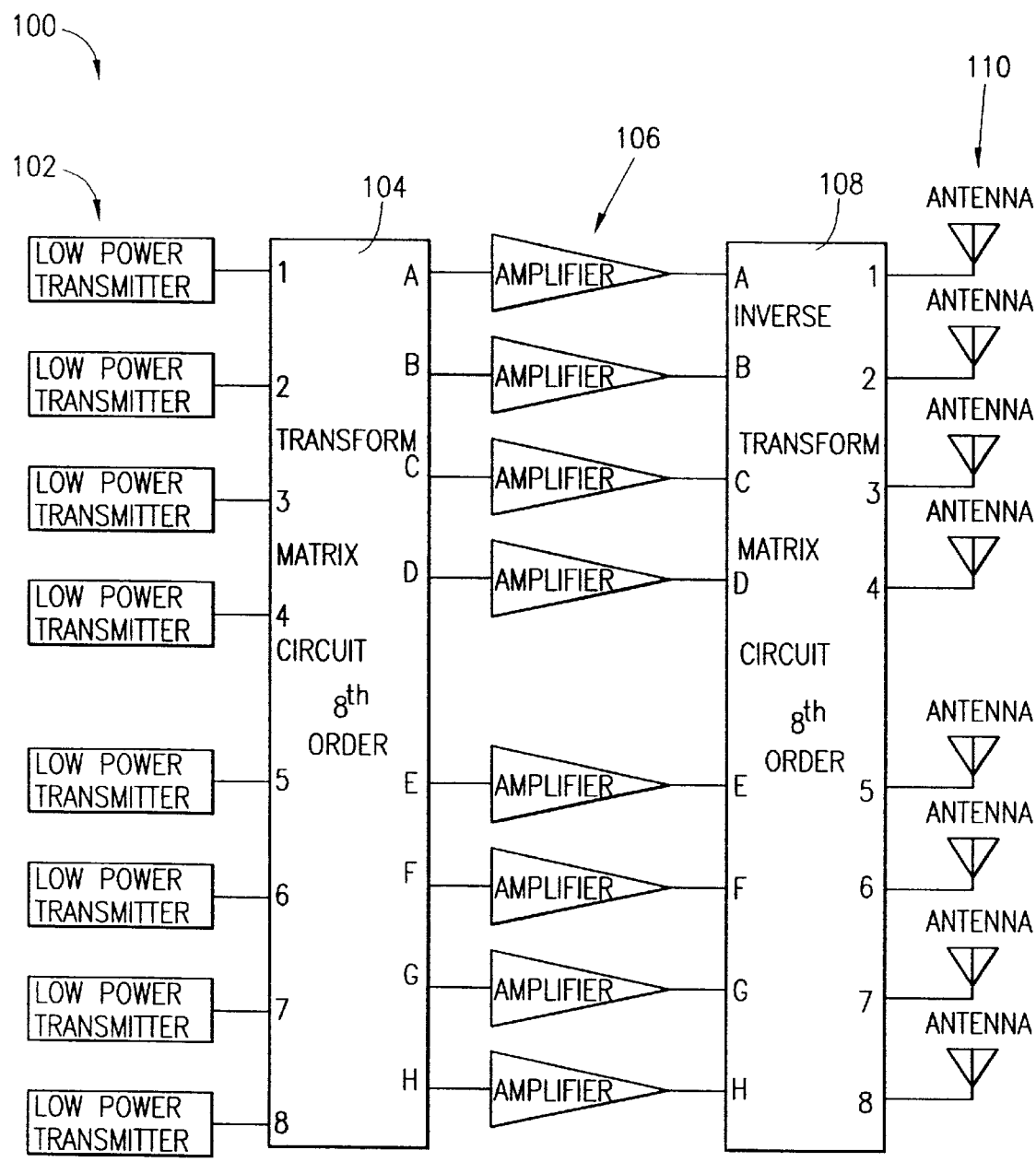
FIG. 1A is block diagrams of a 8 by 8 cellular configurations similar to that shown and described in U.S. patent application Ser. No. 08/683,735.

The 8th order transform matrix circuit 230 includes six input port nos. 1–8 labelled 250, 252, 254, 256, 258, 260 that respectively respond to six RF input signals from the six low power transmitters 202, 204, 206, 208, 210, 212. As shown, in the 6 by 8 cellular configuration 200, the 8th order transform matrix circuit 230 features two input ports 262, 264 that do not receive RF input signals but instead are each coupled to ground via respective resistors Ri1, Ri2. The 8th order transform matrix circuit 230 includes eight outputs ports A, B, C, D, E, F, G, H, for providing 8th order transform matrix RF input signals to the eight amplifiers 232, 234, 236, 238, 240, 242, 244, 246. The 8 by 8 transform matrix circuit 230 is an 8th order Fourier transform matrix with phase shifts shown in FIG. 1C and input/output mapping shown in FIG. 1B.

The eight amplifiers 232, 234, 236, 238, 240, 242, 244, 246 are shared linear power amplifiers that respectively respond to the 8th order transform matrix RF input signals, and provide eight shared linear power amplified transform matrix RF input signals.

The 8th order inverse transform matrix circuit 248 responds to the eight shared linear power amplified transform matrix RF input signals, for providing six inverse transform matrix amplified RF output signals from six output port nos. 1, 2 and 5–8, labelled 270, 272, 278, 280, 282, 284. The 8th order inverse transform matrix circuit 248 includes two output ports nos. 3 and 4, labelled 274, 276, that do not provide inverse transform matrix amplified RF output signals, but instead are each coupled to ground via respective resistors Ro1, Ro2 to dissipate the intermodulation products. The 8th order inverse transform matrix circuit 248 is an 8th order Fourier inverse transform matrix.

In operation, when the six RF input signals are available as input ports, the power sharing amplifying system 201 can be used to improve system operation by sharing the amplifier power, regardless of the distribution of beam loading, as well as providing the improved reliability associated with any amplifier combining system.

The intermodulation products that occur when six signals are applied to any of the amplifiers take a variety of forms (see R. S. Larkin, "Multiple-Signal Intermodulation and Stability Considerations" IEEE Vehicular Technology Conference, 1991). In many amplifiers the dominant intermodulation products are "third order" meaning that they are produced by a cubic nonlinearity in the amplifier. Restricting our consideration to narrow band systems (less than an octave of bandwidth) such as occurs for cellular telephone systems, there is a third-order product for each pair of input signals of the form $2f_a-f_b$, where $f_a$ and $f_b$ are the frequencies of the two signals. Additionally, for each triplet of input signals there is a product of the form $f_a+f_b-f_c$ where again $f_a$, $f_b$ and $f_c$ are the frequencies of the three signals. When there are six input signals there will be 30 different products of the form $2f_a-f_b$ and 60 products of the form $f_a+f_b-f_c$. In many cases multiple products of either type will be present on a single output frequency.

Monte Carlo simulation of the 6 by 8 cellular configuration was done using Matlab™ allows examination of the various products and the resulting output ports. For simulation convenience the six input signals were simulated as 21, 23, 25, 27, 29 and 31 Hz rather then as radio frequencies as would normally be the case of interest. FIG. 3 shows the average power found at each output port of the inverse transform matrix circuit as a function of frequency. For the power levels in the simulation, a power of −9.3 dBw corresponds to the desired signals being transmitted that were applied to ports 1, 2, 3, 4, 5 and 6 of the 8th order transform matrix circuit 230. It can be seen that these appear at output ports 6, 5, 8, 7, 2 and 1 of the 8th order inverse transform matrix circuit 248, and that no desired signal appears at ports 3 or 4 of the 8th order inverse transform matrix circuit 248. This corresponds to the mapping shown in FIG. 1b.

By examining the power levels and statistics of the Matlab simulation results, it is possible to determine the quantity and types of products at each output port/frequency combination of FIG. 3 as follows:

- −61.6 dBW Two-signal 3rd order product, $2f_a-f_b$
- −55.6 Three-signal 3rd order product, $f_a+f_b-f_c$
- −54.8 Two $2f_a-f_b$ plus one $f_c+f_d-f_c$
- −52.2 Two three-signal 3rd order products.

From this it is readily apparent that many output port/frequency combinations have no third-order products at all and others have one, two or three. This steering effect of the intermodulation products permits one to dissipate intermodulation products in resistive terminations that receive no desired signal power. Additionally, it permits one to minimize the effect of intermodulation products by careful choice of antenna ports. For instance, in FIG. 3 there are no third-order intermodulation products lower in frequency than the transmitted frequencies that are sent to output port 6 of the 8th order inverse transform matrix circuit 248.

Experimental measurements of intermodulation in the 6 by 8 cellular configuration were conducted while using less than six input signals, in order to have no more than one product at any output port/frequency combination. These fully verified the steering characteristic of the network as predicted in the simulation.

Although the present invention has been described and discussed herein with respect to embodiments, other arrangements or configurations may also be used that do not depart from the spirit and scope of the invention.

What is claimed is:

1. A power sharing amplifier system for a cellular communications system, comprising:

an 8th order transform matrix circuit having six input ports that respond to six RF input signals and provide 8th order transform matrix RF input signals, the 8th order transform matrix circuit having two input ports that do not receive an input signal, but instead are coupled to ground through a respective matching resistor;

eight amplifiers that respond to the 8th order transform matrix RF input signals and provide eight amplified transformed RF signals; and an 8th order inverse transform matrix circuit that responds to the eight amplified transformed RF signals and provides six 8th order inverse transform amplified RF output signals to six output ports, the 8th order inverse transform matrix circuit having two output dissipation ports that do not provide an output signal to an antenna but instead are coupled to ground through a corresponding respective match resistor for dissipating intermodulation distortion products.

* * * * *